United States Patent
Bian et al.

(10) Patent No.: US 7,439,157 B2
(45) Date of Patent: *Oct. 21, 2008

(54) ISOLATION TRENCHES FOR MEMORY DEVICES

(75) Inventors: Zailong Bian, Boise, ID (US); John Smythe, Boise, ID (US); Janos Fucsko, Boise, ID (US); Michael Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 456 days.

This patent is subject to a terminal disclaimer.

(21) Appl. No.: 11/129,884

(22) Filed: May 16, 2005

(65) Prior Publication Data

US 2005/0287731 A1 Dec. 29, 2005

Related U.S. Application Data

(63) Continuation-in-part of application No. 10/878,805, filed on Jun. 28, 2004, now Pat. No. 7,332,408.

(51) Int. Cl.
*H01L 21/76* (2006.01)
(52) U.S. Cl. ............... 438/435; 438/201; 438/257; 438/258; 438/259; 438/260; 438/261; 438/262; 438/263; 438/264; 438/265; 438/266; 438/267; 257/E21.68
(58) Field of Classification Search ............ 438/201, 438/435, 257, 258, 259, 260, 261, 262, 263, 438/264, 265, 266, 267, 314, 315, 316, 317, 438/318, 319, 320; 257/E21.68
See application file for complete search history.

(56) References Cited

U.S. PATENT DOCUMENTS

| 6,265,281 | B1 | 7/2001 | Reinberg |
| 6,322,634 | B1 | 11/2001 | Pan |
| 6,437,417 | B1 | 8/2002 | Gilton |
| 6,566,229 | B2 | 5/2003 | Hong et al. |
| 6,596,607 | B2 * | 7/2003 | Ahn ............... 438/424 |
| 6,627,529 | B2 | 9/2003 | Ireland |
| 6,693,050 | B1 | 2/2004 | Cui et al. |
| 6,780,721 | B2 | 8/2004 | Farrar |
| 6,867,098 | B2 * | 3/2005 | Park et al. .......... 438/257 |
| 6,897,120 | B2 | 5/2005 | Trapp |
| 2002/0064937 | A1 * | 5/2002 | Kim et al. .......... 438/623 |
| 2005/0116300 | A1 * | 6/2005 | Hieda et al. ........ 257/374 |

OTHER PUBLICATIONS

U.S. Appl. No. 11/962,967.*

(Continued)

*Primary Examiner*—Lynne A. Gurley
*Assistant Examiner*—Samuel A. Gebremariam
(74) *Attorney, Agent, or Firm*—Leffert Jay & Polglaze, P.A.

(57) ABSTRACT

A method includes removing a portion of a substrate to define an isolation trench; forming a first dielectric layer on exposed surfaces of the substrate in the trench; forming a second dielectric layer on at least the first dielectric layer, the second dielectric layer containing a different dielectric material than the first dielectric layer; depositing a third dielectric layer to fill the trench; removing an upper portion of the third dielectric layer from the trench and leaving a lower portion covering a portion of the second dielectric layer; oxidizing the lower portion of the third dielectric layer after removing the upper portion; removing an exposed portion of the second dielectric layer from the trench, thereby exposing a portion of the first dielectric layer; and forming a fourth dielectric layer in the trench covering the exposed portion of the first dielectric layer.

85 Claims, 11 Drawing Sheets

OTHER PUBLICATIONS

S.H. Shin et al.; Data Retention Time and Electrical Characteristics of Cell Transistor According to STI Materials in 90nm DRAM; Journal of Semiconductor Technology and Science; vol. 3, No. 2; Jun. 2003; pp. 69-75.

Sukesh Sandhu, "Method for Filling Shallow Isolation Trenches and Other Recesses During the Formation of a Semiconductor Device and Electronic Systems Including the Semiconductor Device," (24 pages including drawings) U.S. Appl. No. 11/371,680, filed Mar. 8, 2006.

* cited by examiner

ISOLATION TRENCHES FOR MEMORY DEVICES

RELATED APPLICATIONS

This is a continuation in part application of U.S. patent application Ser. No. 10/878,805, filed Jun. 28, 2004 now U.S. Pat. No. 7,332,408, titled "ISOLATION TRENCHES FOR MEMORY DEVICES," which application is commonly assigned, the entire contents of which are incorporated herein by reference.

TECHNICAL FIELD OF THE INVENTION

The present invention relates generally to memory devices and in particular the present invention relates to isolation trenches for memory devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

Memory devices are typically formed on semiconductor substrates using semiconductor fabrication methods. The array of memory cells is disposed on the substrate. Isolation trenches formed in the substrate within the array and filled with a dielectric, e.g., shallow trench isolation (STI), provide voltage isolation on the memory array by acting to prevent extraneous current flow through the substrate between the memory cells. The isolation trenches are often filled using a physical deposition process, e.g., with high-density plasma (HDP) oxides. However, the spacing requirements for flash memory arrays often require the isolation trenches to have relatively narrow widths, resulting in large aspect (or trench-depth-to-trench-width) ratios. The large aspect ratios often cause voids to form within the dielectric while filling these trenches using physical sputtering processes.

Filling the trenches with spin-on-dielectrics (SODs) can reduce the formation of voids within the dielectric during filling. However, spin-on-dielectrics usually have to be cured (or annealed) after they are disposed within the trenches, e.g., using a steam-oxidation process that can result in unwanted oxidation of the substrate and of layers of the memory cells overlying the substrate. To protect against such oxidation, the trenches can be lined with a nitride liner prior to filling the trenches with a spin-on-dielectric. One problem with nitride liners is that they can store trapped charges that can adversely affect the reliability of the memory cells and thus the memory device.

For the reasons stated above, and for other reasons stated below which will become apparent to those skilled in the art upon reading and understanding the present specification, there is a need in the art for alternatives to existing trench-fill methods.

SUMMARY

The above-mentioned problems with filling isolation trenches and other problems are addressed by the present invention and will be understood by reading and studying the following specification.

For one embodiment, the invention provides a method of forming a portion of an integrated circuit device contained on a semiconductor substrate. The method includes removing a portion of the substrate to define an isolation trench and forming a first dielectric layer on exposed surfaces of the substrate in the trench. Forming a second dielectric layer on at least the first dielectric layer, where the second dielectric layer contains a different dielectric material than the first dielectric layer is included in the method. The method includes depositing a third dielectric layer to fill the trench, removing an upper portion of the third dielectric layer from the trench and leaving a lower portion covering a portion of the second dielectric layer, and oxidizing the lower portion of the third dielectric layer after removing the upper portion. Removing an exposed portion of the second dielectric layer from the trench, thereby exposing a portion of the first dielectric layer is included in the method, as is forming a fourth dielectric layer in the trench covering the exposed portion of the first dielectric layer.

For another embodiment, the invention provides a method of forming a portion of an integrated circuit device contained on a semiconductor substrate. The method includes removing a portion of the substrate to define an isolation trench and forming a first dielectric layer on exposed surfaces of the substrate in the trench. Forming a second dielectric layer on at least the first dielectric layer, where the second dielectric layer contains a different dielectric material than the first dielectric layer is included in the method. The method includes partially filling the trench with a silicon rich oxide material, oxidizing the silicon rich oxide material, causing surplus silicon of the silicon rich oxide material to form silicon oxide. Removing an exposed portion of the second dielectric layer from the trench, thereby exposing a portion of the first dielectric layer is included in the method, as is forming a third dielectric layer in the trench covering the exposed portion of the first dielectric layer.

Further embodiments of the invention include methods and apparatus of varying scope.

DETAILED DESCRIPTION

Figure 1:
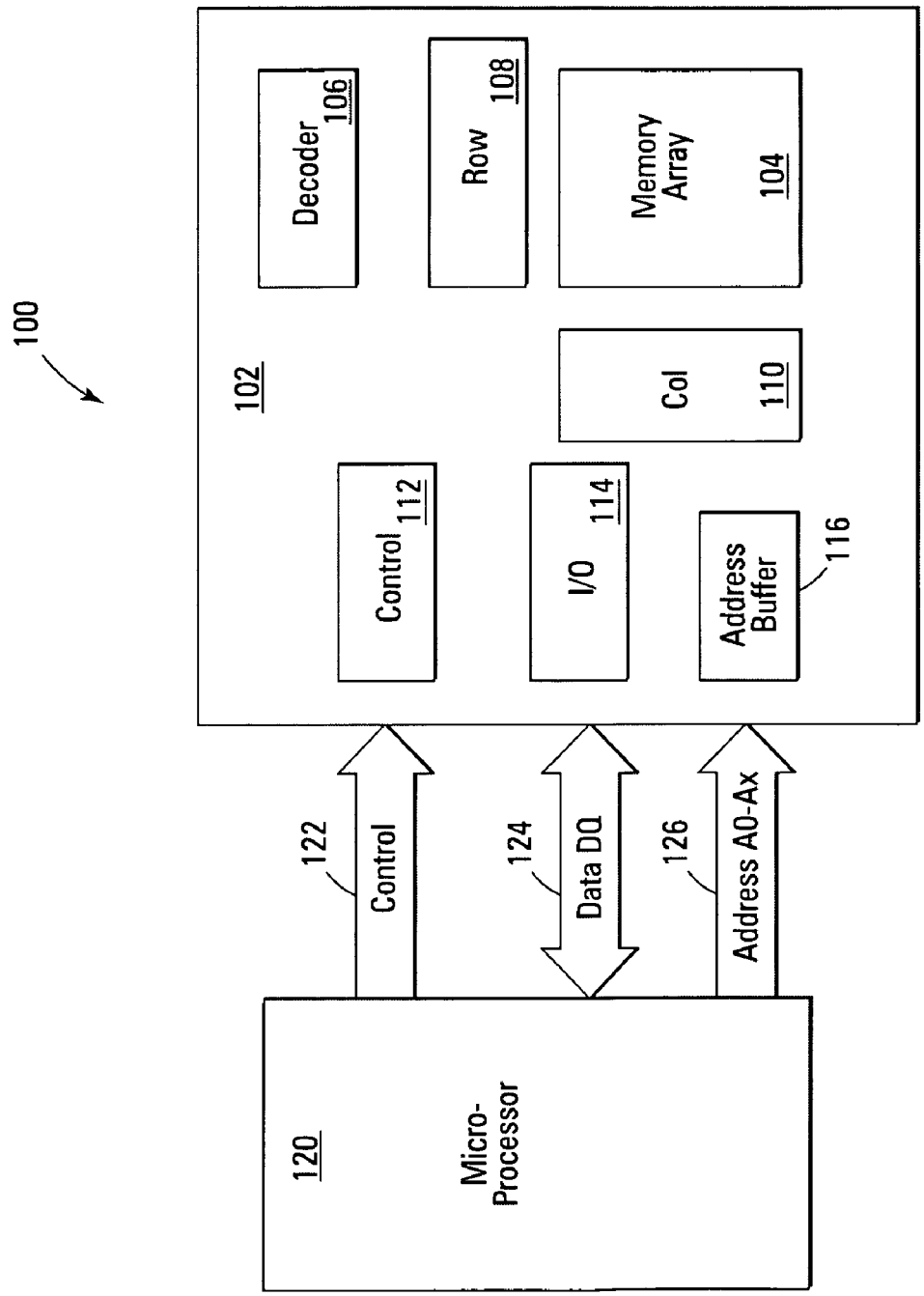
FIG. 1 is a simplified block diagram of a memory system, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a simplified block diagram of a memory system 100, according to an embodiment of the invention. Memory system 100 includes an integrated circuit memory device 102, such as a flash memory device, e.g., a NAND or NOR memory device, a DRAM, an SDRAM, etc., that includes an array of memory cells 104 and a region peripheral to memory array 104 that includes an address decoder 106, row access circuitry 108, column access circuitry 110, control circuitry 112, Input/Output (I/O) circuitry 114, and an address buffer 116. The row access circuitry 108 and column access circuitry 110 may include high-voltage circuitry, such as high-voltage pumps. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, the memory cells are flash memory cells that include a floating-gate field-effect transistor capable of holding a charge. The cells may be grouped into blocks. Each of the cells within a block can be electrically programmed on an individual basis by charging the floating gate. The charge can be removed from the floating gate by a block erase operation.

For one embodiment, memory array 104 is a NOR flash memory array. A control gate of each memory cell of a row of the array is connected to a word line, and a drain region of each memory cell of a column of the array is connected to a bit line. The memory array for NOR flash memory devices is accessed by row access circuitry, such as the row access circuitry 108 of memory device 102, activating a row of floating gate memory cells by selecting the word line connected to their control gates. The row of selected memory cells then place their data values on the column bit lines by flowing a differing current, depending upon their programmed states, from a connected source line to the connected column bit lines.

For another embodiment, memory array 104 is a NAND flash memory array also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by row access circuitry, such as the row access circuitry 108 of memory device 102, activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Figure 2A:
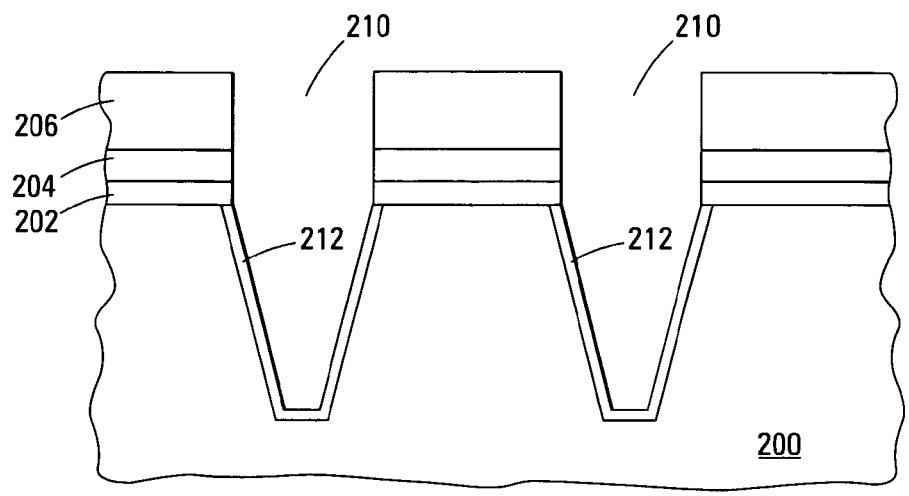
FIGS. 2A-2H are cross-sectional views of a portion of a memory device during various stages of fabrication, according to another embodiment of the invention.

FIGS. 2A-2H are cross-sectional views of a portion of a memory device, such as a portion of the memory device 102, during various stages of fabrication, according to another embodiment of the invention. FIG. 2A depicts the portion of the memory device after several processing steps have occurred. Formation of the structure depicted in FIG. 2A is well known and will not be detailed herein.

In general, the structure of FIG. 2A is formed by forming a first dielectric layer 202 on a substrate 200, e.g., of silicon or the like. For one embodiment, the first dielectric layer 202 is a gate dielectric layer (or tunnel dielectric layer), such as a tunnel oxide layer. A conductive layer 204, e.g., a layer of doped polysilicon, is formed on the first dielectric layer 202, and a hard mask layer 206 is formed on the conductive layer 204. The mask layer 206 can be a second dielectric layer, such as a nitride layer, e.g., a silicon nitride ($Si_3N_4$) layer.

Trenches 210 are subsequently formed through the mask layer 206, the conductive layer 204, and the first dielectric layer 202 and extend into substrate 200. This can be accomplished by patterning the mask layer 206 and etching. A third dielectric layer 212 may then be formed on portions of the substrate 200 exposed by the trenches 210 so as to line the portion of trenches 210 formed in substrate 200.

Figure 2B:
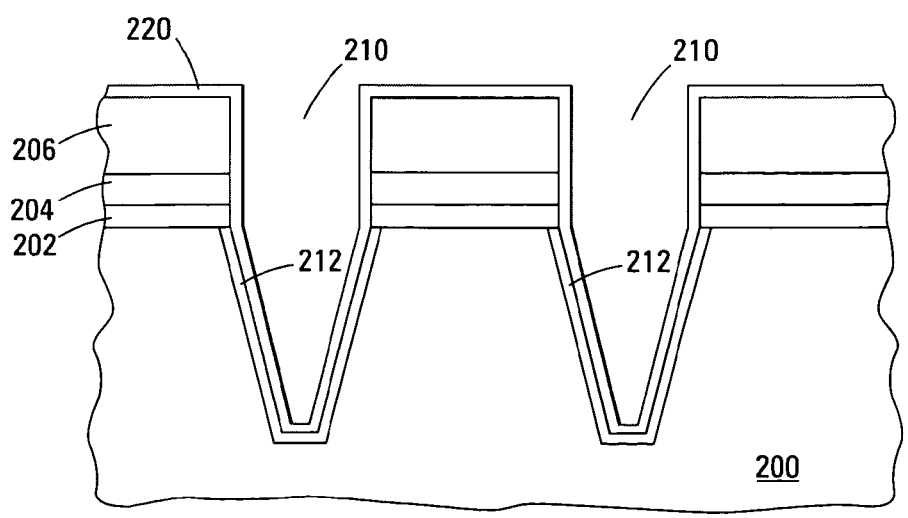

A fourth dielectric layer 220, such as a nitride layer, e.g., a silicon nitride layer, is formed on the structure of FIG. 2A in FIG. 2B, such as by blanket deposition, and acts as an oxidation barrier layer for one embodiment. Specifically, the fourth dielectric layer 220 is formed on an upper surface of mask layer 206 and on portions of the mask layer 206, the conductive layer 204, and the first dielectric layer 202 through which trenches 210 pass. The fourth dielectric layer 220 is also formed on the third dielectric layer 212. In this way, the fourth dielectric layer 220 lines trenches 210. For one embodiment, the third dielectric layer 212 acts to provide adhesion between substrate 200 and the fourth dielectric layer 220 and acts as a stress release layer for relieving stresses that would otherwise form between substrate 200 and the fourth dielectric layer 220. For another embodiment, the third dielectric layer 212 is a pad oxide layer and can be a thermal oxide layer. For another embodiment, the third dielectric layer 212 is, for example, a layer of deposited silicon dioxide ($SiO_2$).

Figure 2C:
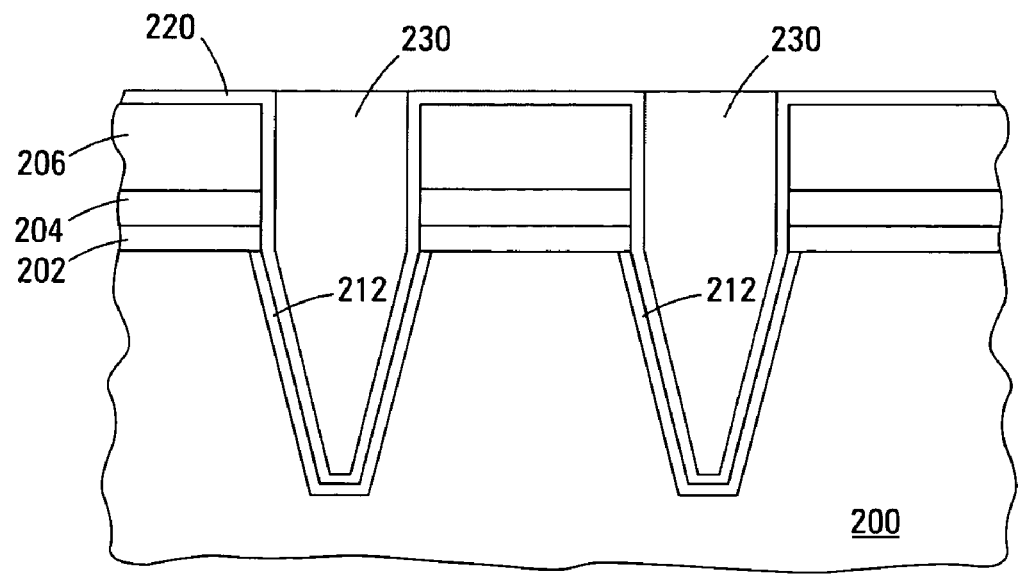

A fifth dielectric layer 230 is deposited within each of the trenches 210 on the fourth dielectric layer 220 in FIG. 2C to either fill or partially fill trenches 210. For one embodiment, the fifth dielectric layer 230 is spin-on dielectric (SOD) material, such as a spin-on glass, hydrogen silsesquioxane (HSQ), hexamethyldisiloxane, polysilazane, octamethyltrisiloxane, etc. The fifth dielectric layer 230 is then cured (or annealed), e.g., using a steam-oxidation process, if necessary. For one embodiment, the fourth dielectric layer 204 acts to prevent oxidation of the substrate 200 and the conductive layer 204 during curing.

Figure 3:
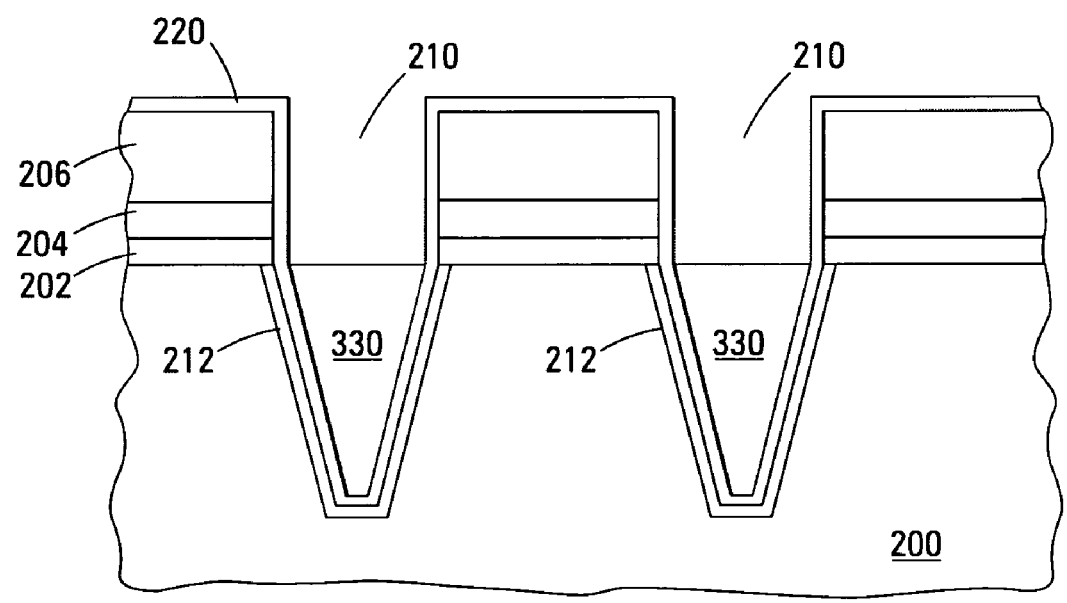
FIG. 3 is a cross-sectional view of a portion of a memory device during a stage of fabrication, according to yet another embodiment of the invention.

For one embodiment, the fifth dielectric layer 230 is formed as shown in FIG. 3. Each of the trenches 210 is partially filled with a silicon-rich oxide material 330. The silicon-rich oxide material 330 is then oxidized, e.g., using a steam oxidation process, causing the surplus silicon to form silicon oxide that expands. The expansion of the silicon oxide acts to exert a compressive stress on adjacent silicon, which has been shown to improve carrier mobility and thus transistor gain control. For one embodiment, the expansion is achieved when the silicon-rich oxide material 330 has a molar ratio of silicon to oxygen within a range of about 1:1 to about 2:1. For another embodiment, the ratio may be adjusted, dependent upon on the steam and temperature conditions used for the steam oxidation, in order to obtain a desired degree of expansion or resulting compressive stress.

Figure 2D:
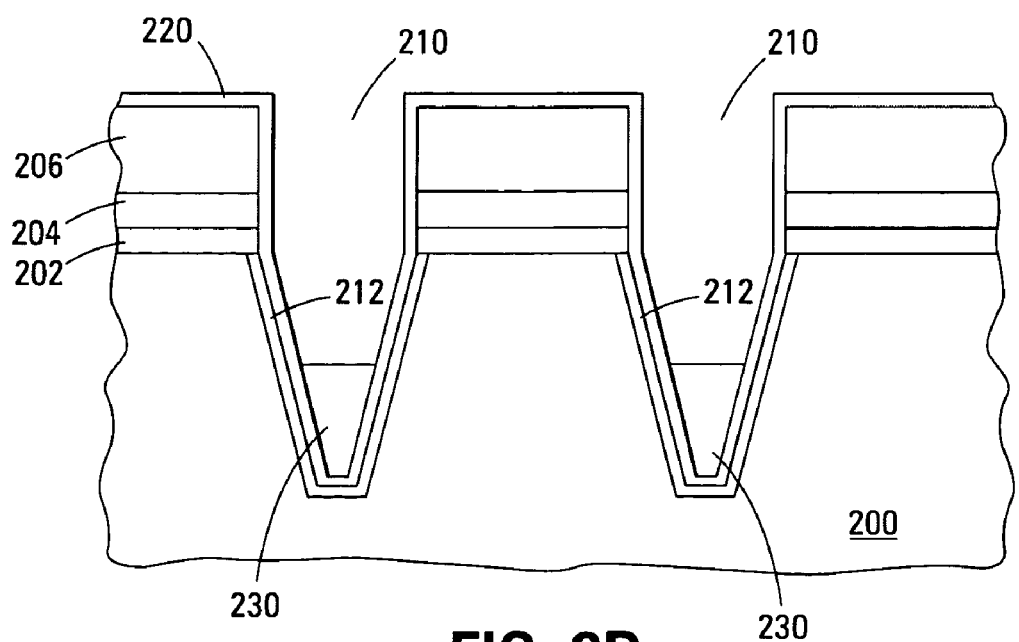

In FIG. 2D, a portion of the fifth dielectric layer 230 is removed, such as by etching in an etch-back process, so that an upper surface of the fifth dielectric layer 230 is recessed within the respective trenches 210, e.g., below an upper surface of substrate 200, exposing a portion of the fourth dielectric layer 220 lining each of trenches 210. For embodiments where fifth dielectric layer 230 is a polysilazane-based SOD material, the etch-back process for removing the portion of the fifth dielectric layer 230 includes using a mixture of deionized water and ammonium hydroxide, at a temperature in the range from about 20° C. to about 90° C., preferably at about 55° C. For other embodiments where the fifth dielectric layer 230 is spin-on dielectric (SOD) material, e.g., polysilazane, the fifth dielectric layer 230 is cured, e.g., using the steam-oxidation process, after the removal of the portion of the fifth dielectric layer 230, i.e., is performed for the structure of FIG. 2D.

Figure 2E:
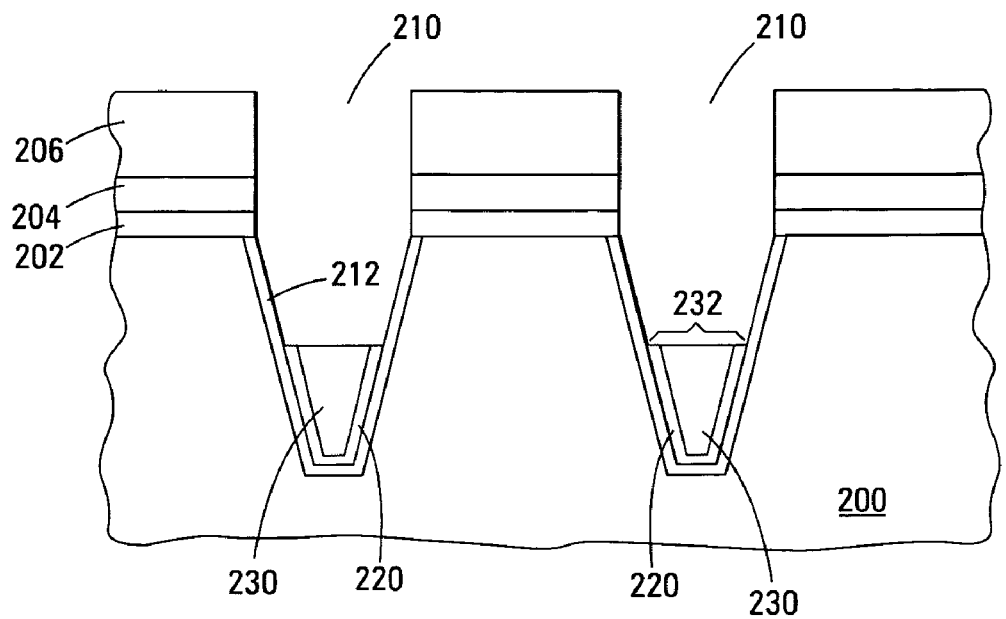

A portion of the fourth dielectric layer 220 is selectively removed in FIG. 2E, e.g., using a controlled wet etch, to a level of the upper surface of the fifth dielectric layer 230 such that a remaining portion of the fourth dielectric layer 220 is interposed between the fifth dielectric layer 230 and the third dielectric layer 212. That is, the fourth dielectric layer 220 is removed from an upper surface of the mask layer 206, and the exposed portion of the fourth dielectric layer 220 located within each of trenches 210 is removed. This exposes the upper surface of the mask layer 206, the portions of the mask layer 206, the conductive layer 204, and the first dielectric layer 202 through which trenches 210 pass, and a portion of the third dielectric layer 212 lying between the upper surface of substrate 200 and the upper surface of the fifth dielectric layer. The remaining portions of the fourth dielectric layer 220 and the fifth dielectric layer 230 form a first dielectric plug 232 that fills a lower portion of trenches 210, as shown in FIG. 2E, having an upper surface that is recessed below the upper surface of the substrate 200. For another embodiment, the fourth dielectric layer 220 is removed to a level of an upper surface of the oxidized silicon-rich oxide material 330 of FIG. 3 to form a plug similar to first dielectric plug 232 (not shown in FIG. 3).

Figure 2F:
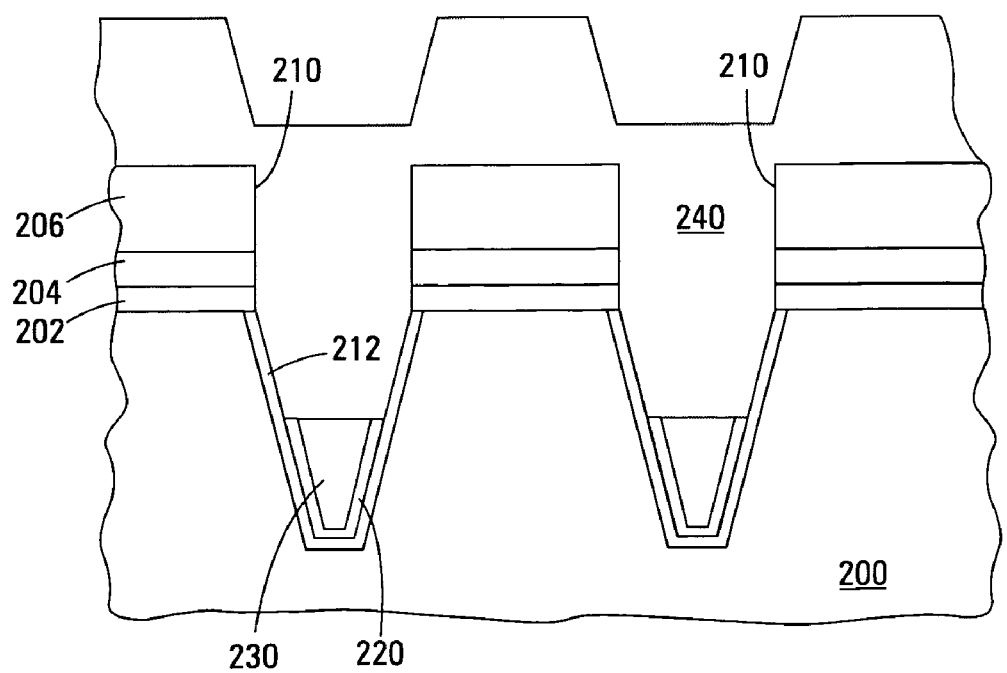

In FIG. 2F, a sixth dielectric layer 240 is blanket deposited over the structure of FIG. 2E and fills an unfilled portion of each of trenches 210. Specifically, the sixth dielectric layer 240 is deposited on the exposed upper surface of the mask layer 206, on the exposed portions of the mask layer 206, the conductive layer 204, and the first dielectric layer 202 through which trenches 210 pass, on the portion of the third dielectric layer 212 lying between the upper surface of substrate 200 and the upper surface of the fifth dielectric layer, and on the first dielectric plug 232. For one embodiment, the sixth dielectric layer 240 is of a high-density-plasma (HDP) dielectric material, such as a high-density-plasma (HDP) oxide. Note that the first dielectric plugs 232 reduce the remaining depths of trenches 210 and thus their aspect ratios for the deposition of the sixth dielectric layer 240. The reduced aspect ratios of trenches 210 act to reduce the formation of voids when depositing the sixth dielectric layer 240 within the unfilled portions of trenches 210. For another embodiment, in a similar fashion, the sixth dielectric layer 240 is formed over the structure of FIG. 3 after the removal of the fourth dielectric layer 220 to the level of an upper surface of the oxidized silicon-rich oxide material 330 (not shown in FIG. 3).

Figure 2G:
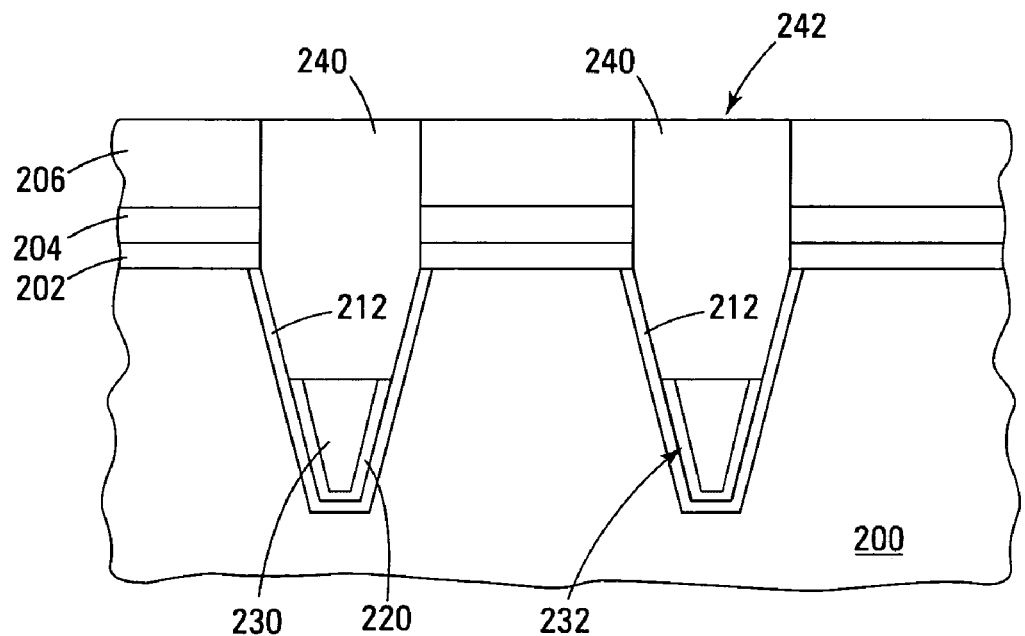

A portion of the sixth dielectric layer 240 is removed from the structure of FIG. 2F in FIG. 2G, e.g., using chemical mechanical polishing (CMP). That is, the sixth dielectric layer 240 is removed so that the upper surface of the mask layer 206 is exposed and so that an upper surface of the sixth dielectric layer 240 within each of trenches 210 is substantially flush with the upper surface of the mask layer 206. Note that the portion of the sixth dielectric layer 240 within each of the trenches 210 forms a second dielectric plug 242 that passes through the mask layer 206, the conductive layer 204, the first conductive layer 202, extends into the substrate 200, and terminates at the first conductive plug 232. The third dielectric layer 212 is interposed between the portion of the second dielectric plug 242 and the substrate 200 and the first dielectric plug 232 and the substrate 200. Note that a structure similar to that of FIG. 2H may be formed from the structure of FIG. 3 after the removal of the fourth dielectric layer 220 and the formation of sixth dielectric layer 240, with the oxidized silicon-rich oxide material 330 replacing the fifth dielectric layer 230.

Note that the fourth dielectric layer 220 is located in the lower portion of each of trenches 210 and thus away from the layers disposed on the upper surface of substrate 200 that can be used to form memory cells. This acts to reduce problems associated with the fourth dielectric layer 220 storing trapped charges, especially when the fourth dielectric layer 220 is of nitride, that can adversely affect the reliability of the memory cells and thus the memory device.

Figure 2H:
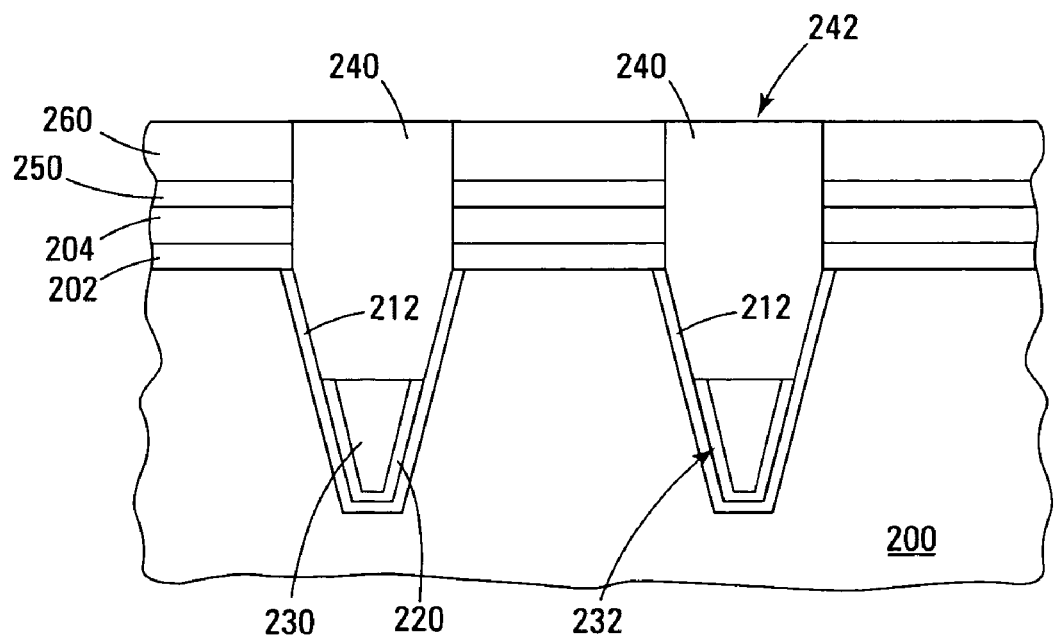

Mask 206 is subsequently removed to expose the conductive layer 204. A seventh dielectric layer 250, e.g., such as a layer of silicon oxide, a nitride, an oxynitride, an oxide-nitride-oxide (ONO) layer, etc., is then formed on the exposed conductive layer 204. A conductive layer 260, such as a doped polysilicon layer, a metal layer, e.g., refractory metal layer, a metal containing layer, e.g., a metal silicide layer, or the like, is formed on the seventh dielectric layer 250, as shown in FIG. 2H. The conductive layer 260 may include one or more conductive materials or conductive layers, a metal or metal containing layer disposed on a polysilicon layer, etc. For another embodiment, conductive layers 204 and 260 respectively form a floating gate and a control gate (or word line) of memory cells of a memory array, such as memory array 104 of FIG. 1, and the seventh dielectric layer 250 forms an intergate dielectric layer that separates the floating gate and the control gate. Source/drain regions are also formed in a portion of substrate 200 not shown in FIG. 2G as a part of the memory array. For one embodiment, conductive layer 204 is extended to improve the coupling of the floating gate. The trenches 210 filled with dielectric materials, as described above, act to prevent extraneous current flow through the substrate between the memory cells.

The components located in the region peripheral to memory array 104 of FIG. 1 (hereinafter the periphery) are also formed on the substrate 200. For one embodiment the periphery may include address decoder 106, row access circuitry 108, column access circuitry 110, control circuitry 112, Input/Output (I/O) circuitry 114, and address buffer 116 of memory device 102, as shown in FIG. 1. For another embodiment, the row access circuitry 108 and column access circuitry 110 may include high-voltage circuitry, such as high-voltage pumps. For some embodiments, the periphery includes passive elements, such as capacitors, and active elements, such as transistors, e.g., field-effect transistors.

Figure 4A:
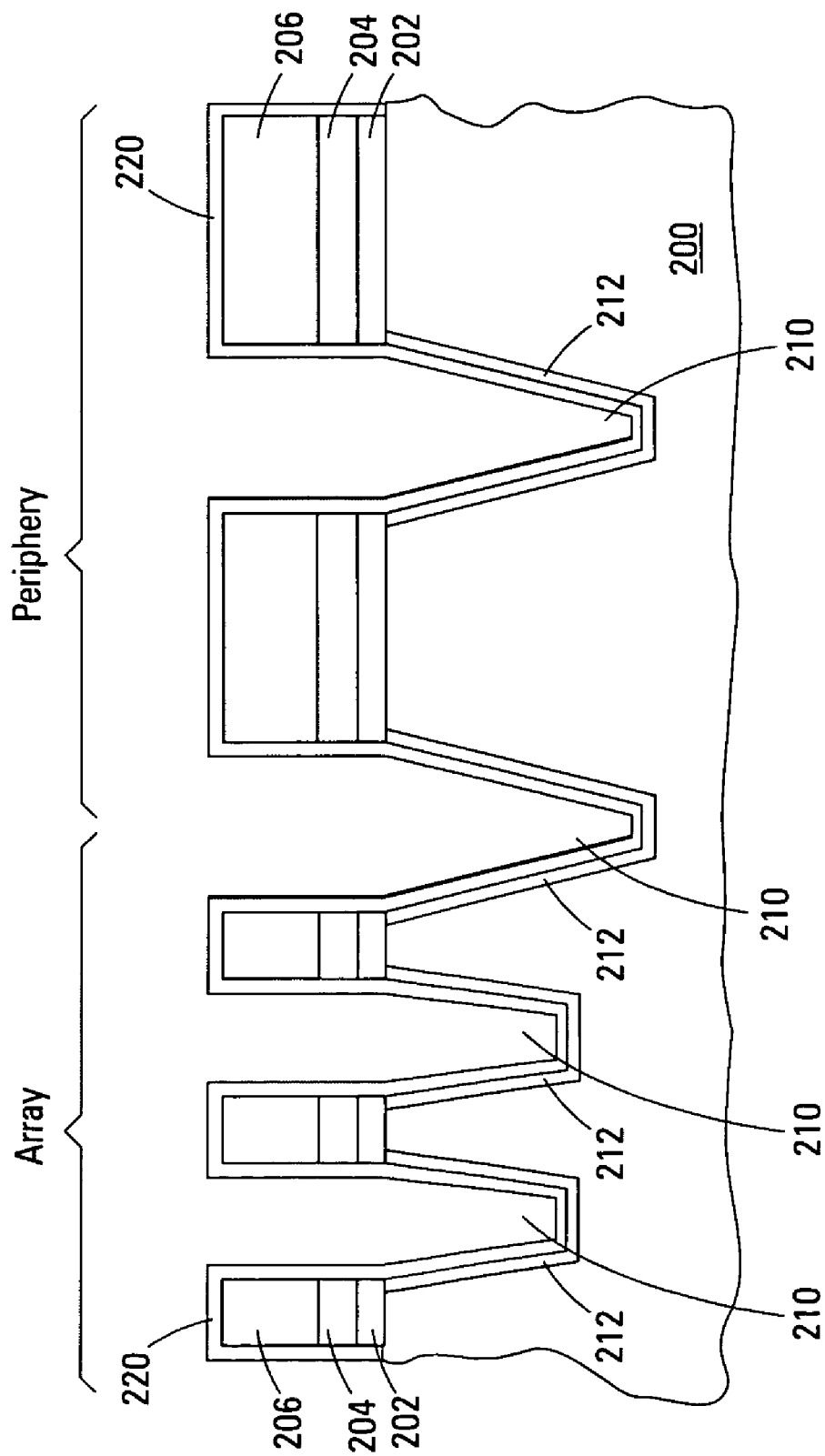
FIGS. 4A-4E are cross-sectional views of a portion of a memory device during various stages of fabrication, according to still another embodiment of the invention.

For some embodiments, a memory array and a periphery are formed overlying the substrate 200, as shown in FIGS. 4A through 4E at different stages of fabrication, according to another embodiment of the invention. The structure of FIG. 4A, for one embodiment, is formed essentially as described for FIGS. 2A-2B. That is, the first dielectric layer 202, the conductive layer 204, and the mask layer 206 are formed overlying substrate 200; trenches 210 are formed through the mask layer 206, the conductive layer 204, and the first dielectric layer 202 such that trenches 210 extend into substrate 200; the portion of trenches 210 extending into substrate 200 is lined with the third dielectric layer 212; and the fourth dielectric layer 220 is formed overlying the first dielectric layer 202, the conductive layer 204, the mask layer 206, and the third dielectric layer 212. For one embodiment, the trenches 210 in the periphery are deeper and/or wider than the trenches 210 in the array and thus have a larger volume than the trenches 210 in the array, as shown in FIG. 4A.

Figure 4B:
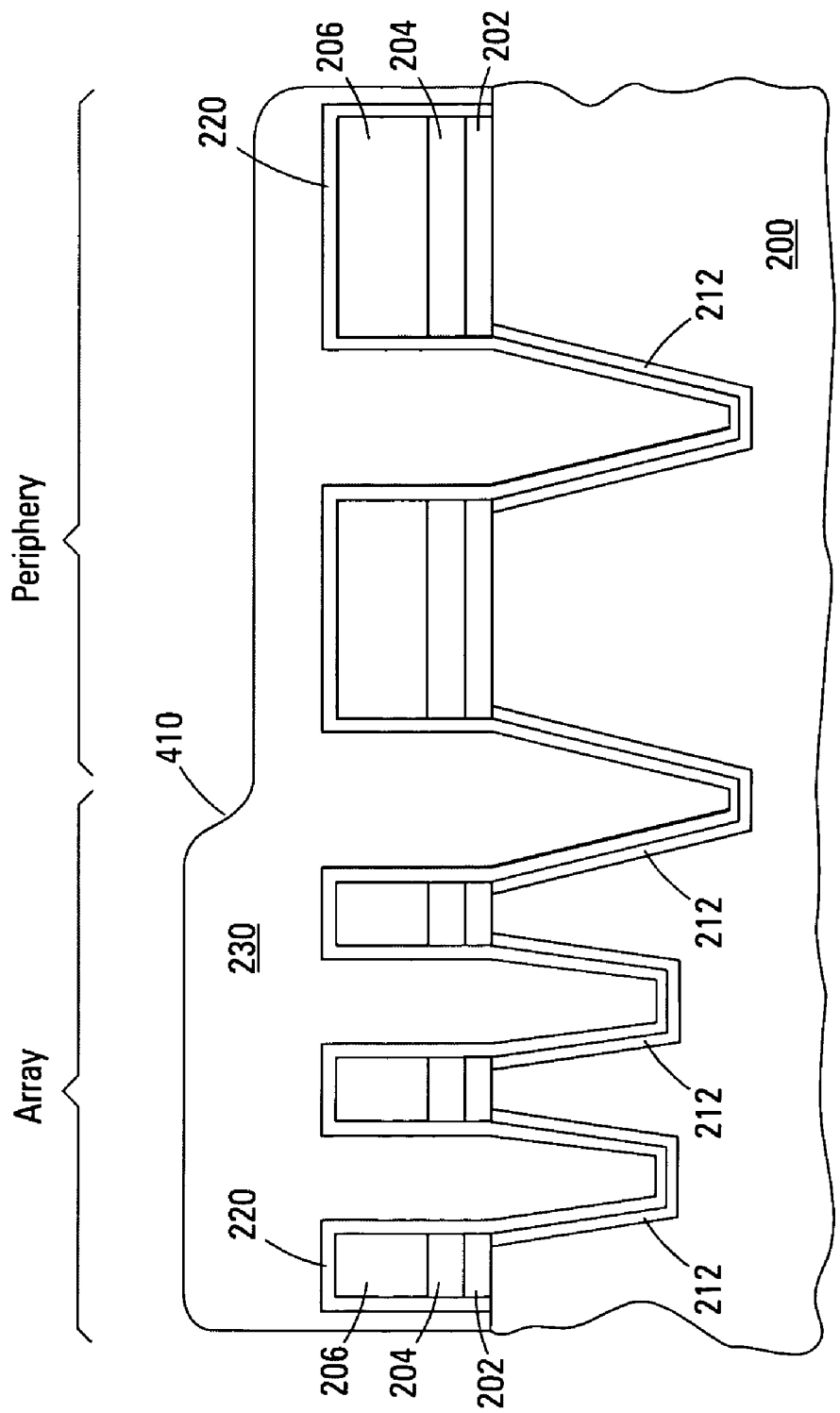
Figure 4C:
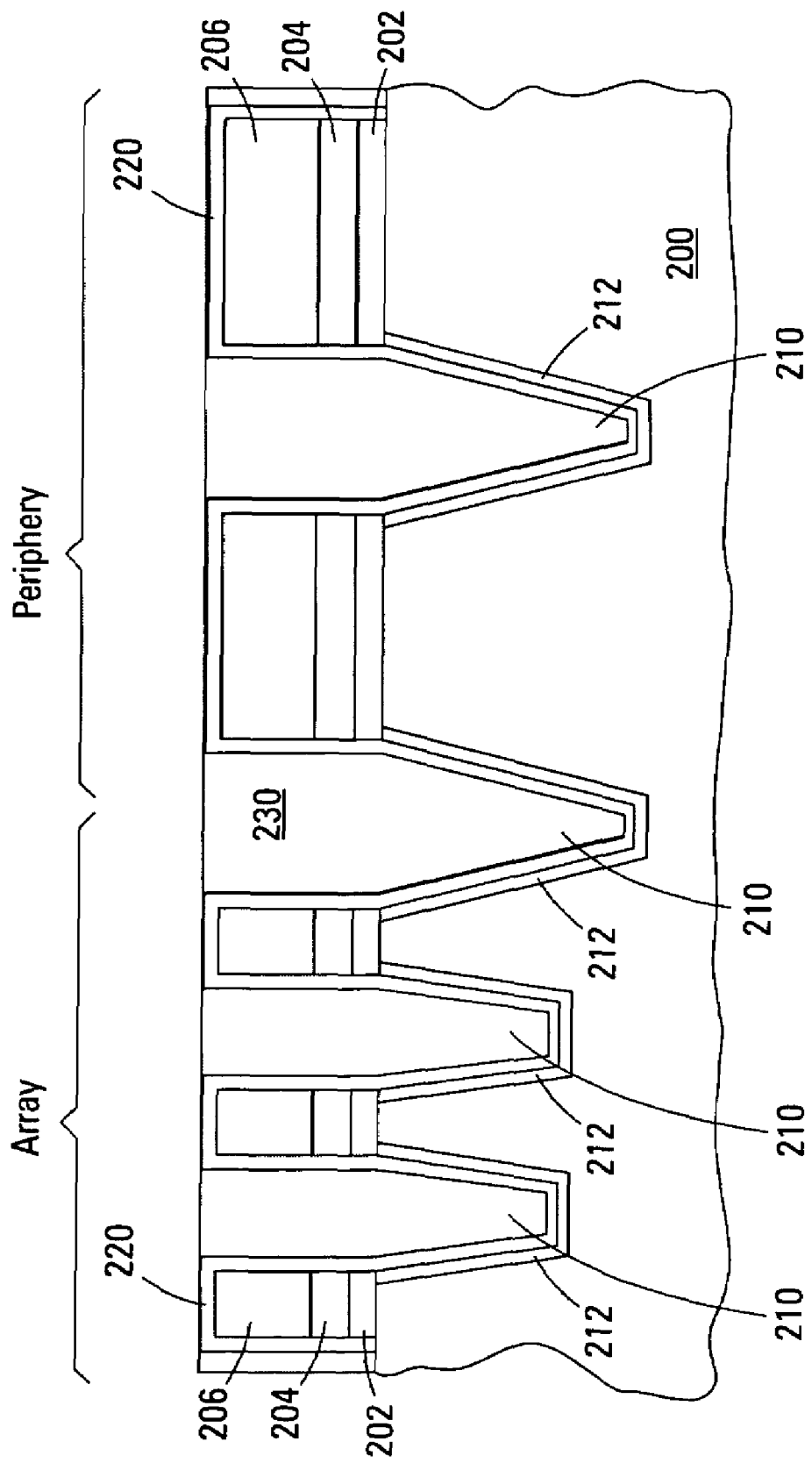

The fifth dielectric layer 230 is deposited overlying the structure of FIG. 4A in FIG. 4B so that dielectric material of the fifth dielectric layer 230 overfills trenches 210. For the embodiment where the trenches 210 in the periphery have a larger volume than those in the array, more dielectric material is required to fill the trenches 210 of the periphery. Therefore, the trenches 210 of the array are filled more quickly than the trenches 210 of the periphery, and continued deposition of the dielectric material of the fifth dielectric layer 230 overfills the trenches 210 of the periphery. This, coupled with the fluid properties of the dielectric material, causes a step 410 to form in the fifth dielectric layer 230 between the array and the periphery, as shown in FIG. 4B. In FIG. 4C, a portion of the fifth dielectric layer 230 is removed, e.g., by CMP, so that step 410 is removed and an upper surface of the fifth dielectric layer 230 is substantially level, i.e., so that the upper surface of the fifth dielectric layer 230 in the periphery and the upper surface of the fifth dielectric layer 230 in the array are substantially co-planer. For one embodiment, the removal of the fifth dielectric layer 230 proceeds until an upper surface of the fifth dielectric layer 230 is substantially flush with an upper surface of the fourth dielectric layer 220, as shown in FIG. 4C.

For another embodiment, the removal proceeds until the fifth dielectric layer 230 is substantially level and overlies the upper surface of the fourth dielectric layer 220 (not shown).

Figure 4D:
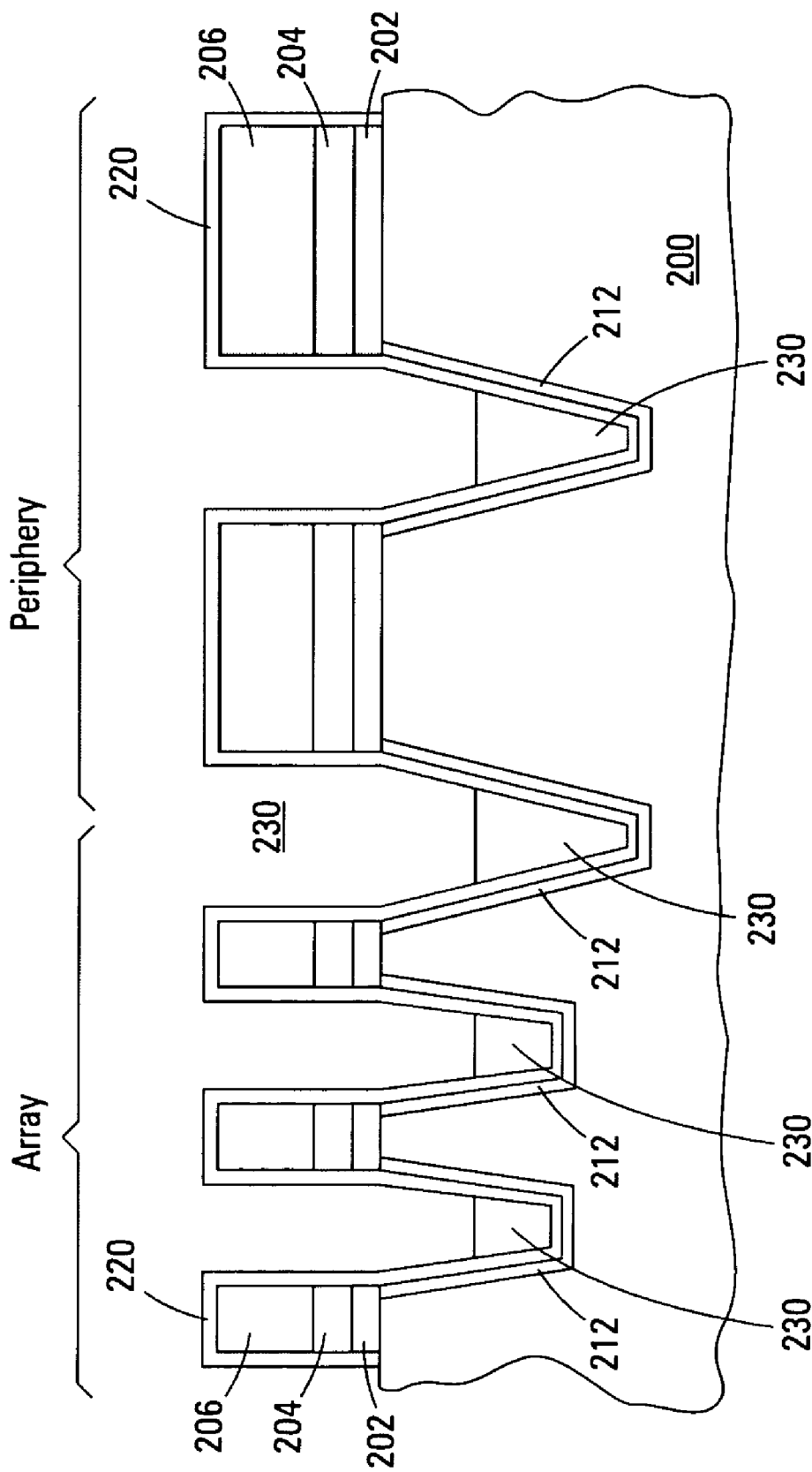
Figure 4E:
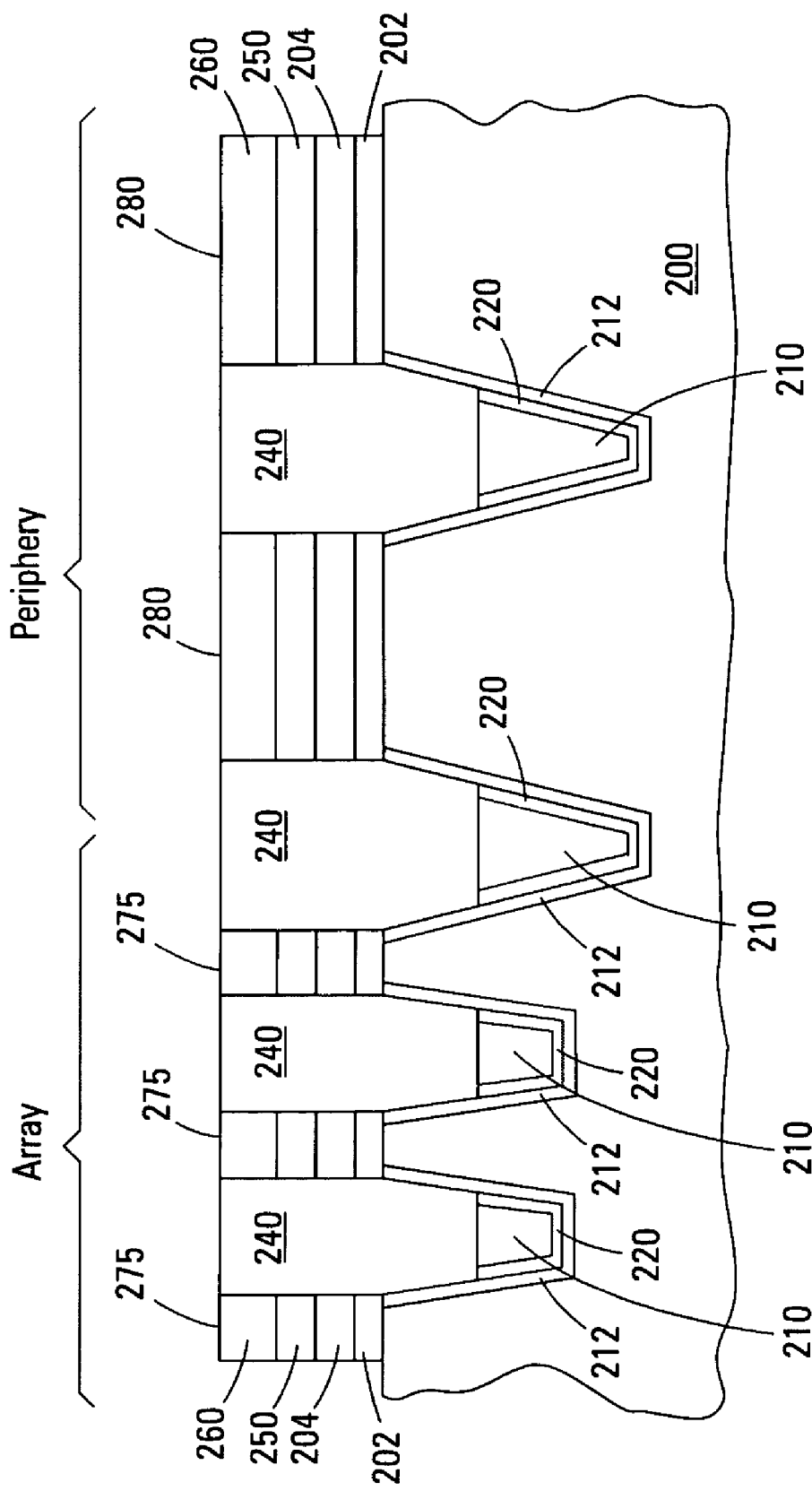

In FIG. 4D, the fifth dielectric layer 230 is recessed within the respective trenches 210, e.g., using an etch-back process, as described above in conjunction with FIG. 2D. Note further that leveling the fifth dielectric layer 230 prior to recessing the fifth dielectric layer 230 within the respective trenches 210 acts so that the fifth dielectric layer 230 is recessed to substantially the same level below the first dielectric layer 202 within the array and periphery trenches. Subsequently, for one embodiment, the process proceeds as described above for FIGS. 2E-2H to form the structure of FIG. 4E. That is, a portion of the fourth dielectric layer 220 is selectively removed to a level of the upper surface of the fifth dielectric layer 230; the sixth dielectric layer 240 is formed to fill the remaining portion of the trenches 210; the hard mask layer 206 is removed; and the seventh dielectric layer 250 and the conductive layer 260 are formed overlying conductive layer 204.

In the array, the gate stacks comprising first dielectric layer 202, the conductive layer 204, the seventh dielectric layer 250, and the conductive layer 260 each form a floating-gate transistor 275 that acts as a memory cell of the array. Each of the gate stacks comprising first dielectric layer 202, the conductive layer 204, the seventh dielectric layer 250, and the conductive layer 260 in the periphery forms a field-effect transistor 280. For some embodiments, the conductive layer 204 and the conductive layer 260 of each field-effect transistor 280 may be strapped (or shorted) together so that the shorted together conductive layers form the control gate of that field-effect transistor 280. For another embodiment, the conductive layers 204 and 260 are not shorted together, and the conductive layer 204 forms the control gate of the field-effect transistors 280. Note that field-effect transistors 280, for one embodiment, form a portion of the logic of row access circuitry 108 and/or column access circuitry 110 of the memory device 102 of FIG. 1 for accessing rows and columns of the memory array 104.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a portion of an integrated circuit device contained on a semiconductor substrate, the method comprising:

removing a portion of the substrate to define an isolation trench;

forming a first dielectric layer in contact with exposed surfaces of the substrate in the trench;

forming a second dielectric layer in contact with at least the first dielectric layer, wherein the second dielectric layer is a nitride layer;

forming a third dielectric layer in contact with the second dielectric layer to fill the trench, wherein the third dielectric layer is a layer of spin on dielectric material;

removing an upper portion of the third dielectric layer from the trench and leaving a lower portion covering a portion of the second dielectric layer;

oxidizing the lower portion of the third dielectric layer after removing the upper portion;

removing an exposed portion of the second dielectric layer from the trench, thereby exposing a portion of the first dielectric layer; and forming a fourth dielectric layer in the trench covering the exposed portion of the first dielectric layer.

2. The method of claim 1, wherein forming the first dielectric layer comprises forming a thermal oxide and wherein the semiconductor substrate is a silicon-containing substrate.

3. The method of claim 1, wherein removing the upper portion of the third dielectric layer from the trench comprises etching.

4. The method of claim 1, wherein the second dielectric layer is chosen to protect the substrate from the oxidizing process.

5. A method of forming a portion of an integrated circuit device contained on a semiconductor substrate, the method comprising:

removing a portion of the substrate to define an isolation trench;

forming a first dielectric layer in contact with exposed surfaces of the substrate in the trench;

forming a second dielectric layer in contact with at least the first dielectric layer, wherein the second dielectric layer is a nitride layer;

partially filling the trench with a silicon rich oxide material so that the silicon rich oxide material is in contact with the second dielectric layer;

oxidizing the silicon rich oxide material, causing surplus silicon of the silicon rich oxide material to form silicon oxide;

removing an exposed portion of the second dielectric layer from the trench, thereby exposing a portion of the first dielectric layer; and forming a third dielectric layer in the trench covering the exposed portion of the first dielectric layer.

6. The method of claim 5, wherein forming the first dielectric layer comprises forming a thermal oxide and wherein the semiconductor substrate is a silicon-containing substrate.

7. The method of claim 5, wherein the second dielectric layer is chosen to protect the substrate from the oxidizing process.

8. A method of forming a portion of a memory device, comprising:

forming a trench through a conductive layer disposed on a first dielectric layer disposed on an upper surface of a substrate, the trench extending into the substrate below the upper surface of the substrate to expose a portion of the substrate below the upper surface of the substrate;

lining the trench below the upper surface of the substrate with a second dielectric layer by forming the second dielectric layer on the exposed portion of the substrate below the upper surface of the substrate;

forming a third dielectric layer overlying portions of the conductive layer and the first dielectric layer through which the trench passes, and on the second dielectric layer;

forming a fourth dielectric layer on the third dielectric layer so that the fourth dielectric layer fills the trench at least to a level above the upper surface of the substrate;

removing a portion of the fourth dielectric layer so that an upper surface of the fourth dielectric layer is recessed below the upper surface of the substrate;

oxidizing the fourth dielectric layer after removing the portion thereof;

selectively removing a portion of the third dielectric layer to a level of the upper surface of the fourth dielectric layer after oxidizing the fourth dielectric layer to expose portions of the conductive layer and the first dielectric layer through which the trench passes and a portion of the second dielectric layer located between the upper surface of the fourth dielectric layer and the upper surface of the substrate; and forming a fifth dielectric layer on the exposed portions of the conductive layer and the first dielectric layer through which the trench passes, the exposed portion of the second dielectric layer, and on the upper surface of the of the fourth dielectric layer, wherein the fifth dielectric layer fills the trench above the upper surface of the of the fourth dielectric layer.

9. The method of claim 8, wherein forming the trench comprises patterning a mask layer disposed on the conductive layer and etching.

10. The method of claim 9, further comprising removing the fifth dielectric layer to expose an upper surface of the mask layer and so that an upper surface of the fifth dielectric layer within the trench is substantially flush with the upper surface of the mask layer.

11. The method of claim 10, wherein removing the fifth dielectric layer comprises chemical mechanical polishing.

12. The method of claim 8, wherein selectively removing a portion of the third dielectric layer is accomplished using wet etching.

13. The method of claim 8, wherein removing a portion of the fourth dielectric layer comprises an etch-back process.

14. The method of claim 8, wherein the fourth dielectric layer is a spin-on dielectric layer and the fifth dielectric layer is a high-density-plasma oxide layer.

15. The method of claim 8, wherein forming the second dielectric layer comprises an oxidation process.

16. A method of forming a portion of a memory device, comprising:

forming a tunnel dielectric layer on an upper surface of a substrate;

forming a conductive layer on the tunnel dielectric layer;

forming a hard mask on the conductive layer;

forming a trench through the hard mask, the conductive layer, and the tunnel dielectric layer and into the substrate to expose a portion of the substrate below the upper surface of the substrate;

forming a stress-relieving and adhesion layer on the exposed portion of the substrate below the upper surface of the substrate;

forming a barrier layer on the hard mask, on portions of the conductive layer and the tunnel dielectric layer through which the trench passes, and on the stress-relieving and adhesion layer;

forming a layer of spin-on dielectric material on the barrier layer so that the layer of spin-on dielectric material fills the trench to a level at least above the upper surface of the substrate;

removing a portion of the spin-on dielectric material so that an upper surface of the spin-on dielectric material is recessed below the upper surface of the substrate;

oxidizing the spin-on dielectric material after removing the portion thereof after oxidizing the spin-on dielectric material, selectively removing a portion of the barrier layer to a level of the upper surface of the oxidized layer of spin-on dielectric material to expose the hard mask, portions of the conductive layer and the tunnel dielectric layer through which the trench passes, and a portion of the stress-relieving and adhesion layer located between the upper surface of the oxidized layer of spin-on dielectric material and the upper surface of the substrate;

forming a layer of high-density-plasma dielectric material on the exposed hard mask, the exposed portions of the conductive layer and the tunnel dielectric layer through which the trench passes, the exposed portion of the stress-relieving and adhesion layer, and on the upper surface of the oxidized layer of spin-on dielectric material, wherein the layer of high-density-plasma material fills the trench above the upper surface of the oxidized layer of spin-on dielectric material; and removing the layer of high-density-plasma dielectric material to expose an upper surface of the hard mask and so that an upper surface of the layer of high-density-plasma dielectric material within the trench is substantially flush with the upper surface of the hard mask.

17. The method of claim 16, wherein the stress-relieving and adhesion layer facilitates adhering the barrier layer to the substrate and relieving stresses between the substrate and the barrier layer.

18. The method of claim 16, wherein the barrier layer acts to limit oxidation of the substrate during the oxidation process.

19. The method of claim 16, wherein the tunnel dielectric layer is a tunnel oxide.

20. The method of claim 16, wherein the high-density-plasma dielectric material is a high-density-plasma oxide.

21. The method of claim 16, wherein the barrier layer and the hard mask are nitrides.

22. The method of claim 16, wherein the conductive layer is a polysilicon layer.

23. The method of claim 16, wherein removing the layer of high-density-plasma dielectric material comprises chemical mechanical polishing.

24. The method of claim 16, wherein forming the trench comprises patterning the hard mask and etching.

25. The method of claim 16, wherein selectively removing a portion of the barrier layer is accomplished using wet etching.

26. The method of claim 25, wherein removing a portion of the spin-on dielectric material comprises an etch-back process.

27. The method of claim 26, wherein the etch-back process comprises a wet etch.

28. The method of claim 26, wherein the etch-back process comprises using a mixture of deionized water and ammonium hydroxide.

29. The method of claim 16, further comprising:
removing the hard mask from the conductive layer;
forming an intergate dielectric layer on the conductive layer; and
forming another conductive layer on the intergate dielectric layer.

30. The method of claim 16, wherein forming the stress-relieving and adhesion layer comprises an oxidation process.

31. A method of forming a portion of a memory device, comprising:
forming a trench through a conductive layer disposed on a first dielectric layer disposed on an upper surface of a substrate, the trench extending into the substrate below the upper surface of the substrate to expose a portion of the substrate below the upper surface of the substrate;
lining the trench below the upper surface of the substrate with a second dielectric layer by forming the second dielectric layer on the exposed portion of the substrate below the upper surface of the substrate;
forming a third dielectric layer overlying portions of the conductive layer and the first dielectric layer through which the trench passes, and on the second dielectric layer;
partially filling the trench with a silicon rich oxide material;
oxidizing the silicon rich oxide material, causing surplus silicon of the silicon rich oxide material to form silicon oxide, thereby forming a fourth dielectric layer within the trench overlying the second and third dielectric layers;
selectively removing a portion of the third dielectric layer to a level of an upper surface of the fourth dielectric layer to expose portions of the conductive layer and the first dielectric layer through which the trench passes and a portion of the second dielectric layer located between the upper surface of the fourth dielectric layer and the upper surface of the substrate; and
forming a fifth dielectric layer on the exposed portions of the conductive layer and the first dielectric layer through which the trench passes, the exposed portion of the second dielectric layer, and on the upper surface of the of the fourth dielectric layer, wherein the fifth dielectric layer fills the trench above the upper surface of the of the fourth dielectric layer.

32. The method of claim 31, wherein forming the trench comprises patterning a mask layer disposed on the conductive layer and etching.

33. The method of claim 32, further comprising removing the fifth dielectric layer to expose an upper surface of the mask layer and so that an upper surface of the fifth dielectric layer within the trench is substantially flush with the upper surface of the mask layer.

34. The method of claim 33, wherein removing the fifth dielectric layer comprises chemical mechanical polishing.

35. The method of claim 31, wherein selectively removing a portion of the third dielectric layer is accomplished using wet etching.

36. The method of claim 31, wherein forming the second dielectric layer comprises an oxidation process.

37. A method of forming a portion of a memory device, comprising:
forming a tunnel dielectric layer on an upper surface of a substrate;
forming a conductive layer on the tunnel dielectric layer;
forming a hard mask on the conductive layer;
forming a trench through the hard mask, the conductive layer, the tunnel dielectric layer, and into the substrate to expose a portion of the substrate below the upper surface of the substrate;
lining the trench below the upper surface of the substrate with a stress-relieving and adhesion layer;
lining the trench with a barrier layer by forming the barrier layer on the hard mask, on portions of the conductive layer and the tunnel dielectric layer through which the trench passes, and on the stress-relieving and adhesion layer lining the trench;
partially filling the trench with a silicon rich oxide material;
oxidizing the silicon rich oxide material, causing surplus silicon of the silicon rich oxide material to form silicon oxide;
selectively removing a portion of the barrier layer to a level of an upper surface of the silicon oxide layer to expose the hard mask, portions of the conductive layer and the first dielectric layer through which the trench passes, and a portion of the stress-relieving and adhesion layer located between the upper surface of the silicon oxide layer and the upper surface of the substrate;

forming a layer of high-density-plasma dielectric material on the exposed hard mask, the exposed portions of the conductive layer and the tunnel dielectric layer through which the trench passes, the exposed portion of the stress-relieving and adhesion layer, and on the upper surface of the silicon oxide layer, wherein the layer of high-density-plasma material fills the trench above the upper surface of the silicon oxide layer; and removing the layer of high-density-plasma dielectric material to expose an upper surface of the hard mask and so that an upper surface of the layer of high-density-plasma dielectric material within the trench is substantially flush with the upper surface of the hard mask.

38. The method of claim 37, wherein the tunnel dielectric layer is a tunnel oxide.

39. The method of claim 37, wherein the high-density-plasma dielectric material is a high-density-plasma oxide.

40. The method of claim 37, wherein the barrier layer and the hard mask are nitrides.

41. The method of claim 37, wherein the conductive layer is a polysilicon layer.

42. The method of claim 37, wherein removing the layer of high-density-plasma dielectric material comprises chemical mechanical polishing.

43. The method of claim 37, wherein forming the trench comprises patterning the hard mask and etching.

44. The method of claim 37, wherein selectively removing a portion of the barrier layer is accomplished using wet etching.

45. The method of claim 37, further comprising:
removing the hard mask from the conductive layer;
forming an intergate dielectric layer on the conductive layer; and
forming another conductive layer on the intergate dielectric layer.

46. A method of forming a portion of a memory device, comprising:
forming a first portion of a first dielectric layer on an upper surface of a first portion of a substrate, and forming a second portion of the first dielectric layer on an upper surface of a second portion of the substrate;
forming a first portion of a conductive layer on the first portion of the first dielectric layer, and forming a second portion of the conductive layer on the second portion of the first dielectric layer;
forming one or more first trenches through the first portion of the conductive layer and the first portion of the first dielectric layer so that each first trench extends into the first portion of the substrate below the upper surface of the first portion of the substrate;
forming one or more second trenches through the second portion of the conductive layer and the second portion of the first dielectric layer so that each second trench extends into the second portion of the substrate below the upper surface of the second portion of the substrate;
lining the one or more first trenches below the upper surface of the first portion of the substrate with a second dielectric layer;
lining the one or more second trenches below the upper surface of the second portion of the substrate with the second dielectric layer;
forming a first portion of a third dielectric layer overlying portions of the first portion of the conductive layer and the first portion of the first dielectric layer through which the one or more first trenches pass, and on the second dielectric layer lining the one or more first trenches, wherein the first portion of the third dielectric layer lines the one or more first trenches;
forming a second portion of the third dielectric layer overlying portions of the second portion of the conductive layer and the second portion of the first dielectric layer through which the one or more second trenches pass, and on the second dielectric layer lining the one or more second trenches, wherein the second portion of the third dielectric layer lines the one or more second trenches;
forming a first portion of a fourth dielectric layer overlying the first portion of the third dielectric layer so that the first portion of the fourth dielectric layer overfills each of the one or more first trenches;
forming a second portion of the fourth dielectric layer overlying the second portion of the third dielectric layer so that the second portion of the fourth dielectric layer overfills each of the one or more second trenches;
leveling the fourth dielectric layer so that an upper surface of the first portion of the fourth dielectric layer is co-planer with an upper surface of the second portion of the fourth dielectric layer;
recessing the fourth dielectric layer into each of the first and second trenches respectively below the upper surface of the first portion of the substrate and the upper surface of the second portion of the substrate;
oxidizing the recessed fourth dielectric layer within each of the first and second trenches;
selectively removing a portion of the first portion of the third dielectric layer to a level of the recessed fourth dielectric layer within each of the one or more first trenches, after oxidizing the fourth dielectric layer, to expose portions of the first portion of the conductive layer and of the first portion of the first dielectric layer through which the one or more first trenches pass and a portion of the second dielectric layer lining the one or more first trenches and located between an upper surface of the fourth dielectric layer and the upper surface of the first portion of the substrate;
selectively removing a portion of the second portion of the third dielectric layer to a level of the recessed fourth dielectric layer within each of the one or more second trenches, after oxidizing the fourth dielectric layer, to expose portions of the second portion of the conductive layer and of the second portion of the first dielectric layer through which the one or more second trench pass and a portion of the second dielectric layer lining the one or more second trenches and located between an upper surface of the fourth dielectric layer and the upper surface of the second portion of the substrate;
forming a first portion of a fifth dielectric layer on the exposed portions of the first portion of the conductive layer and the first portion of the first dielectric layer through which the one or more first trenches pass, the exposed portion of the second dielectric layer lining the one or more first trenches, and on the upper surface of the of the fourth dielectric layer within each of the one or more first trenches, wherein the first portion of the fifth dielectric layer fills each of the one or more first trenches above the upper surface of the of the fourth dielectric layer; and
forming a second portion of the fifth dielectric layer on the exposed portions of the second portion of the conductive layer and the second portion of the first dielectric layer through which the one or more second trenches pass, the exposed portion of the second dielectric layer lining the one or second trenches, and on the upper surface of the of the fourth dielectric layer within each of the one or more second trenches, wherein the second portion of the fifth dielectric layer fills each of the one or more second trenches above the upper surface of the of the fourth dielectric layer.

47. The method of claim 46, wherein a volume of the one or more second trenches is greater than a volume of the one or more first trenches.

48. The method of claim 46, wherein forming the one or more first trenches and the one or more second trenches comprises respectively patterning a first portion of a mask layer disposed on the first portion of the conductive layer and a second portion of the mask layer disposed on the second portion of the conductive layer and etching.

49. The method of claim 48, further comprising:
removing the first portion of the fifth dielectric layer to expose an upper surface of the first portion of mask layer and so that an upper surface of the first portion of the fifth dielectric layer within each of the first trenches is substantially flush with the upper surface of the first portion of the mask layer; and
removing the second portion of the fifth dielectric layer to expose an upper surface of the second portion of mask layer and so that an upper surface of the second portion of the fifth dielectric layer within each of the second trenches is substantially flush with the upper surface of the second portion of the mask layer.

50. The method of claim 49, wherein removing the first and second portions of the fifth dielectric layer comprises chemical mechanical polishing.

51. The method of claim 46, wherein selectively removing a portion of the first portion of the third dielectric layer and selectively removing a portion of the second portion of the third dielectric layer is accomplished using wet etching.

52. The method of claim 46, wherein recessing the fourth dielectric layer into each of the first and second trenches comprises an etch-back process.

53. The method of claim 52, wherein the etch-back process comprises a wet etch.

54. The method of claim 52, wherein the etch-back process comprises using a mixture of deionized water and ammonium hydroxide.

55. The method of claim 46, wherein forming the second dielectric layer comprises an oxidation process.

56. A method of forming a portion of a memory device, comprising:
forming a first portion of a gate dielectric layer on an upper surface of a first portion of a substrate, and forming a second portion of the gate dielectric layer on an upper surface of a second portion of the substrate;
forming a first portion of a conductive layer on the first portion of the gate dielectric layer, and forming a second portion of the conductive layer on the second portion of the gate dielectric layer;
forming a first portion of a hard mask on the first portion of the conductive layer and a second portion of the hard mask of the second portion of the conductive layer;
forming one or more first trenches through the first portion of the hard mask, the first portion of the conductive layer, and the first portion of the gate dielectric layer so that each first trench extends into the first portion of the substrate below the upper surface of the first portion of the substrate;
forming one or more second trenches through the second portion of the hard mask, the second portion of the conductive layer, and the second portion of the gate dielectric layer so that each second trench extends into the second portion of the substrate below the upper surface of the second portion of the substrate;
lining the one or more first trenches below the upper surface of the first portion of the substrate with a stress-relieving and adhesion layer;
lining the one or more second trenches below the upper surface of the second portion of the substrate with the stress-relieving and adhesion layer;
forming a first portion of a barrier dielectric layer overlying portions of the first portion of the hard mask and the first portion of the conductive layer and the first portion of the gate dielectric layer through which the one or more first trenches pass, and on the stress-relieving and adhesion layer lining the one or more first trenches, wherein the first portion of the barrier layer lines the one or more first trenches;
forming a second portion of the barrier layer overlying portions of the second portion of the hard mask and the second portion of the conductive layer and the second portion of the gate dielectric layer through which the one or more second trenches pass, and on the stress-relieving and adhesion layer lining the one or more second trenches, wherein the second portion of the barrier layer lines the one or more second trenches;
forming a first portion of a spin-on dielectric layer overlying the first portion of the barrier layer so that the first portion of the spin-on dielectric layer overfills each of the one or more first trenches;
forming a second portion of the spin-on dielectric layer overlying the second portion of the barrier layer so that the second portion of the spin-on dielectric layer overfills each of the one or more second trenches;
leveling the spin-on dielectric layer so that an upper surface of the first portion of the spin-on dielectric layer is co-planer with an upper surface of the second portion of the spin-on dielectric layer;
recessing the spin-on dielectric layer into each of the first and second trenches respectively below the upper surface of the first portion of the substrate and the upper surface of the second portion of the substrate;
oxidizing the recessed spin-on dielectric layer within each of the first and second trenches;
selectively removing a portion of the first portion of the barrier layer to a level of the recessed spin-on dielectric layer within each of the one or more first trenches, after oxidizing the spin-on dielectric layer, to expose portions of the first portion of the hard mask, the first portion of the conductive layer and the first portion of the gate dielectric layer through which the one or more first trenches pass, a portion of the stress-relieving and adhesion layer lining the one or more first trenches and located between an upper surface of the spin-on dielectric layer and the upper surface of the first portion of the substrate;
selectively removing a portion of the second portion of the barrier dielectric layer to a level of the recessed spin-on dielectric layer within each of the one or more second trenches, after oxidizing the spin-on dielectric layer, to expose portions of the second portion of the hard mask, the second portion of the conductive layer and the second portion of the gate dielectric layer through which the one or more second trench pass, a portion of the stress-relieving and adhesion layer lining the one or more second trenches and located between an upper surface of the spin-on dielectric layer and the upper surface of the second portion of the substrate;

forming a first portion of a layer of high-density-plasma dielectric material on the exposed portions of the first portion of the hard mask, the first portion of the conductive layer and the first portion of the gate dielectric layer through which the one or more first trenches pass, the exposed portion of the stress-relieving and adhesion layer lining the one or more first trenches, and on the upper surface of the of the spin-on dielectric layer within each of the one or more first trenches, wherein the first portion of the layer of high-density-plasma dielectric material fills each of the one or more first trenches above the upper surface of the of the spin-on dielectric layer;

forming a second portion of the layer of high-density-plasma dielectric material on the exposed portions of the second portion of the hard mask, the second portion of the conductive layer and the second portion of the gate dielectric layer through which the one or more second trenches pass, the exposed portion of the stress-relieving and adhesion layer lining the one or more second trenches, and on the upper surface of the of the spin-on dielectric layer within each of the one or more second trenches, wherein the second portion of the layer of high-density-plasma dielectric material fills each of the one or more second trenches above the upper surface of the of the spin-on dielectric layer; and removing the first and second portions of the layer of high-density-plasma dielectric material to respectively expose upper surfaces of the first and second portions of the hard mask and so that an upper surface of the first portion of the layer of high-density-plasma dielectric material within the one or more first trenches is substantially flush with the upper surface of the first portion of the hard mask and the second portion of the layer of high-density-plasma dielectric material within the one or more second trenches is substantially flush with the upper surface of the second portion of the hard mask.

57. The method of claim 56, wherein the gate dielectric layer is a tunnel oxide.

58. The method of claim 56, wherein the high-density-plasma dielectric material is a high-density-plasma oxide.

59. The method of claim 56, wherein the barrier layer and the hard mask are nitrides.

60. The method of claim 56, wherein the conductive layer is a polysilicon layer.

61. The method of claim 56, wherein removing the layer of high-density-plasma dielectric material comprises chemical mechanical polishing.

62. The method of claim 56, wherein forming the one or more first and second trenches comprises respectively patterning the first and second portions of the hard mask and etching.

63. The method of claim 56, wherein selectively removing a portion of the first portion of the barrier layer and a second portion of the barrier layer is accomplished using wet etching.

64. The method of claim 56, wherein recessing the spin-on dielectric layer comprises an etch-back process.

65. The method of claim 64, wherein the etch-back process comprises a wet etch.

66. The method of claim 64, wherein the etch-back process comprises using a mixture of deionized water and ammonium hydroxide.

67. The method of claim 56, further comprising:
respectively removing the first and second portions of the hard mask from the first and second portions of the conductive layer;
respectively forming first and second portions of a second dielectric layer on the first and second portions of the conductive layer; and
respectively forming first and second portions of another conductive layer on the first and second portions of the second dielectric layer.

68. The method of claim 56, wherein forming the stress-relieving and adhesion layer comprises an oxidation process.

69. A method of forming a portion of a memory device, comprising:
forming a tunnel oxide layer on an upper surface of a substrate;
forming a polysilicon layer on the tunnel oxide layer;
forming a nitride mask layer on the polysilicon layer;
patterning the nitride mask layer and etching to form a trench through the nitride mask layer, the polysilicon layer, tunnel oxide layer and into the substrate to expose a portion of the substrate below the upper surface of the substrate;
forming a second oxide layer on the exposed portion of the substrate below the upper surface of the substrate;
forming a second nitride layer on the nitride mask layer, on portions of the polysilicon layer and the tunnel oxide layer through which the trench passes, and on the second oxide layer;
forming a layer of spin-on dielectric material on the second nitride layer so that the layer of spin-on dielectric material fills the trench to a level at least above the upper surface of the substrate;
after forming a layer of spin-on dielectric material on the second nitride layer, etching away a portion of the layer of spin-on dielectric material so that the layer spin-on dielectric material is recessed below the upper surface of the substrate;
steam oxidizing the recessed layer of spin-on dielectric material;
after steam oxidizing the recessed layer of spin-on dielectric material, selectively etching away a portion of the second nitride layer to a level of an upper surface of the recessed layer of spin-on dielectric material to expose the nitride mask layer, portions of the polysilicon layer and the tunnel oxide layer through which the trench passes, and a portion of the second oxide layer located between the upper surface of the recessed layer of spin-on dielectric material and the upper surface of the substrate;
forming a layer of a high-density-plasma oxide on the exposed nitride mask layer, the exposed portions of the polysilicon layer and the tunnel oxide layer through which the trench passes, the exposed portion of the second oxide layer, and on the upper surface of the recessed layer of spin-on dielectric material, wherein layer of the high-density-plasma oxide fills the trench above the upper surface of the recessed layer of spin-on dielectric material; and
removing the layer of the high-density-plasma oxide by chemical mechanical polishing to expose an upper surface of the nitride mask layer and so that an upper surface of the layer of the high-density-plasma dielectric oxide within the trench is substantially flush with the upper surface of the nitride mask layer.

70. The method of claim 69, further comprising:
removing the nitride mask from the conductive layer;
forming an intergate dielectric layer of the conductive layer; and
forming another conductive layer on the intergate dielectric layer.

71. The method of claim 69, wherein etching away a portion of the layer of spin-on dielectric material comprises using a mixture of deionized water and ammonium hydroxide.

72. A method of forming a portion of a memory device, comprising:
forming a tunnel oxide layer on an upper surface of a substrate;
forming a polysilicon layer on the tunnel oxide layer;
forming a nitride mask layer on the polysilicon layer;
patterning the nitride mask layer and etching to form a trench through the nitride mask layer, the polysilicon layer, tunnel oxide layer and into the substrate to expose a portion of the substrate below the upper surface of the substrate;
forming a second oxide layer on the exposed portion of the substrate below the upper surface of the substrate;
forming a second nitride layer on the nitride mask layer, on portions of the polysilicon layer and the tunnel oxide layer through which the trench passes, and on the second oxide layer;
partially filling the trench with a silicon rich oxide material;
oxidizing the silicon rich oxide material, causing surplus silicon of the silicon rich oxide material to form silicon oxide;
selectively etching away a portion of the second nitride layer to a level of an upper surface of the silicon oxide to expose the nitride mask layer, portions of the polysilicon layer and the tunnel oxide layer through which the trench passes, and a portion of the second oxide layer located between the upper surface of the silicon oxide and the upper surface of the substrate;
forming a layer of a high-density-plasma oxide on the exposed nitride mask layer, the exposed portions of the polysilicon layer and the tunnel oxide layer through which the trench passes, the exposed portion of the second oxide layer, and on the upper surface of the silicon oxide, wherein layer of the high-density-plasma oxide fills the trench above the upper surface of the silicon oxide; and
removing the layer of the high-density-plasma oxide by chemical mechanical polishing to expose an upper surface of the nitride mask layer and so that an upper surface of the layer of the high-density-plasma dielectric oxide within the trench is substantially flush with the upper surface of the nitride mask layer.

73. The method of claim 72, further comprising:
removing the nitride mask from the conductive layer;
forming an intergate dielectric layer of the conductive layer; and
forming another conductive layer on the intergate dielectric layer.

74. A method of forming a portion of a floating-gate memory device, comprising:
forming a first dielectric layer as a tunnel dielectric layer on a semiconductor substrate;
forming a first conductive layer as a floating-gate layer on the first dielectric layer;
patterning the first dielectric layer and first conductive layer to define at least one isolation region;
removing a portion of the substrate to define a trench in the at least one isolation region;
forming a second dielectric layer on exposed surfaces of the substrate in the trench;
forming a third dielectric layer on at least the second dielectric layer, wherein the third dielectric layer contains a different dielectric material than the second dielectric layer;
forming a layer of spin-on dielectric material in the trench to form a fourth dielectric layer on the third dielectric layer;
removing an upper portion of the fourth dielectric layer from the trench and leaving a lower portion covering a portion of the third dielectric layer;
oxidizing the lower portion of the fourth dielectric layer after removing the upper portion;
removing an exposed portion of the third dielectric layer from the trench, thereby exposing a portion of the second dielectric layer;
forming a fifth dielectric layer in the trench covering the exposed portion of the second dielectric layer;
forming a sixth dielectric layer as an intergate dielectric layer overlying the first conductive layer;
forming a second conductive layer as a control gate layer overlying the sixth dielectric layer; and
patterning the first dielectric layer, the first conductive layer, the sixth dielectric layer and the second conductive layer to define at least one floating-gate memory cell.

75. The method of claim 74, further comprising:
forming a hard mask overlying the first conductive layer before patterning the first dielectric layer and first conductive layer; and
removing the hard mask before forming the sixth dielectric layer overlying the first conductive layer.

76. The method of claim 74, wherein the second conductive layer comprises one or more conductive layers.

77. The method of claim 76, wherein the one or more conductive layers of the second conductive layer comprise at least one of a polysilicon layer and a metal containing layer.

78. The method of claim 74, wherein forming a first conductive layer as a floating-gate layer further comprises extending the floating-gate layer.

79. The method of claim 74, wherein the sixth dielectric layer comprises one or more dielectric layers.

80. A method of forming a portion of a floating-gate memory device, comprising:
forming a first dielectric layer as a tunnel dielectric layer on a semiconductor substrate;
forming a first conductive layer as a floating-gate layer on the first dielectric layer;
patterning the first dielectric layer and first conductive layer to define at least one isolation region;
removing a portion of the substrate to define a trench in the at least one isolation region;
forming a second dielectric layer on exposed surfaces of the substrate in the trench;
forming a third dielectric layer on at least the second dielectric layer, wherein the third dielectric layer contains a different dielectric material than the second dielectric layer;
partially filling the trench with a silicon rich oxide, wherein the silicon rich oxide overlies the third dielectric layer within the trench;
oxidizing the silicon rich oxide, causing surplus silicon of the silicon rich oxide to form silicon oxide, wherein the silicon oxide forms a fourth dielectric layer on the third dielectric layer;
removing an exposed portion of the third dielectric layer from the trench, thereby exposing a portion of the second dielectric layer;

forming a fifth dielectric layer in the trench covering the exposed portion of the second dielectric layer;

forming a sixth dielectric layer as an intergate dielectric layer overlying the first conductive layer;

forming a second conductive layer as a control gate layer overlying the sixth dielectric layer; and patterning the first dielectric layer, the first conductive layer, the sixth dielectric layer and the second conductive layer to define at least one floating-gate memory cell.

81. The method of claim 80, further comprising:

forming a hard mask overlying the first conductive layer before patterning the first dielectric layer and first conductive layer; and removing the hard mask before forming the sixth dielectric layer overlying the first conductive layer.

82. The method of claim 80, wherein the second conductive layer comprises one or more conductive layers.

83. The method of claim 82, wherein the one or more conductive layers of the second conductive layer comprise at least one of a polysilicon layer and a metal containing layer.

84. The method of claim 80, wherein forming a first conductive layer as a floating-gate layer further comprises extending the floating-gate layer.

85. The method of claim 80, wherein the sixth dielectric layer comprises one or more dielectric layers.

* * * * *

UNITED STATES PATENT AND TRADEMARK OFFICE
CERTIFICATE OF CORRECTION

PATENT NO. : 7,439,157 B2  Page 1 of 1
APPLICATION NO. : 11/129884
DATED : October 21, 2008
INVENTOR(S) : Bian et al.

It is certified that error appears in the above-identified patent and that said Letters Patent is hereby corrected as shown below:

In column 10, line 14, in Claim 8, after "surface" delete "of the".

In column 10, line 16, in Claim 8, after "surface" delete "of the".

In column 10, line 63, in Claim 16, delete "thereof" and insert -- thereof; --, therefor.

In column 12, line 24, in Claim 31, after "surface" delete "of the".

In column 12, line 26, in Claim 31, after "surface" delete "of the".

In column 14, line 62, in Claim 46, after "surface" delete "of the".

In column 15, line 2, in Claim 46, after "surface" delete "of the".

In column 15, line 6, in Claim 46, after "surface" delete "of the".

In column 17, line 10, in Claim 56, after "surface" delete "of the".

In column 17, line 14, in Claim 56, after "surface" delete "of the".

In column 17, line 22, in Claim 56, after "surface" delete "of the".

In column 17, lines 26-27, in Claim 56, after "surface" delete "of the".

Signed and Sealed this

Thirteenth Day of January, 2009

JON W. DUDAS
*Director of the United States Patent and Trademark Office*